(12) United States Patent
    Tapily et al.

(10) Patent No.: US 12,577,665 B2
(45) Date of Patent: Mar. 17, 2026

(54) NEXT GENERATION BONDING LAYER FOR 3D HETEROGENEOUS INTEGRATION

(71) Applicant: Tokyo Electron Limited, Tokyo (JP)

(72) Inventors: Kandabara Tapily, Albany, NY (US);
    Soo Doo Chae, Albany, NY (US);
    Satohiko Hoshino, Albany, NY (US);
    Hojin Kim, Albany, NY (US); Adam Gildea, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 688 days.

(21) Appl. No.: 17/894,105

(22) Filed: Aug. 23, 2022

(65) Prior Publication Data

US 2024/0071984 A1    Feb. 29, 2024

(51) Int. Cl.
    *H01L 23/00* (2006.01)
    *C23C 16/40* (2006.01)
    *C23C 16/455* (2006.01)
    *C23C 16/56* (2006.01)

(52) U.S. Cl.
    CPC ............ *H01L 24/80* (2013.01); *C23C 16/403* (2013.01); *C23C 16/45536* (2013.01); *C23C 16/56* (2013.01); *H01L 2224/80011* (2013.01); *H01L 2224/8002* (2013.01); *H01L 2224/80236* (2013.01); *H01L 2224/80379* (2013.01); *H01L 2224/80895* (2013.01); *H01L 2224/80896* (2013.01)

(58) Field of Classification Search
    None
    See application file for complete search history.

(56) References Cited

U.S. PATENT DOCUMENTS

| | | | | |
|---|---|---|---|---|
| 7,862,885 B2 * | 1/2011 | Tong | .................. | B81C 1/00357 |
| | | | | 428/457 |
| 8,361,901 B2 * | 1/2013 | Vick | ..................... | H01L 23/481 |
| | | | | 438/455 |
| 8,802,538 B1 | 8/2014 | Liu et al. | | |
| 10,046,542 B2 * | 8/2018 | Adib | ..................... | C03C 23/006 |
| 10,796,913 B2 | 10/2020 | Lin | | |
| 2003/0000645 A1 * | 1/2003 | Dornfest | .................. | H10D 1/68 |
| | | | | 257/E21.279 |

(Continued)

FOREIGN PATENT DOCUMENTS

| | | | | | |
|---|---|---|---|---|---|
| CN | 107043086 A | * | 8/2017 | ......... | H01L 21/3105 |
| CN | 107004639 B | * | 2/2021 | .......... | H10D 86/201 |

(Continued)

OTHER PUBLICATIONS

International Search Report and Written Opinion dated May 23, 2024 on PCT App.PCT/US2024/012477 (10 pages).

(Continued)

*Primary Examiner* — Michael Lebentritt
(74) *Attorney, Agent, or Firm* — Foley & Lardner LLP

(57) ABSTRACT

Devices and methods for forming semiconductor devices are disclosed. The semiconductor device can include a plurality of semiconductor wafers. The plurality of semiconductor wafers can have a dielectric bonding layer disposed thereupon. The dielectric bonding layers can be treated to increase a bonding energy with other semiconductor wafers. A wafer having a treatment applied to a bonding layer can be bonded to another wafer.

18 Claims, 10 Drawing Sheets

(56)                References Cited

U.S. PATENT DOCUMENTS

| | | | |
|---|---|---|---|
| 2007/0224776 A1* | 9/2007 | Chiou | H01L 21/76898 |
| | | | 438/455 |
| 2010/0259296 A1* | 10/2010 | Or-Bach | H03K 19/17748 |
| | | | 326/38 |
| 2010/0291749 A1* | 11/2010 | Or-Bach | H10D 88/101 |
| | | | 257/E21.598 |
| 2011/0169125 A1 | 7/2011 | Reinmuth et al. | |
| 2012/0129301 A1* | 5/2012 | Or-Bach | H10B 41/41 |
| | | | 438/129 |
| 2014/0377960 A1 | 12/2014 | Koiwa | |
| 2017/0104426 A1* | 4/2017 | Mills | C25B 1/04 |
| 2019/0088618 A1 | 3/2019 | Tsumura et al. | |
| 2019/0362984 A1 | 11/2019 | Katsunuma | |
| 2020/0105720 A1* | 4/2020 | Yuan | H01L 21/02554 |
| 2020/0303361 A1* | 9/2020 | Shih | H01L 24/33 |
| 2021/0028135 A1* | 1/2021 | Said | H01L 24/80 |
| 2021/0335745 A1 | 10/2021 | Chen et al. | |
| 2022/0406613 A1 | 12/2022 | Takata et al. | |
| 2023/0140107 A1* | 5/2023 | Uzoh | H01L 21/6836 |
| | | | 228/206 |
| 2023/0395466 A1* | 12/2023 | Chuang | H01L 21/02183 |

FOREIGN PATENT DOCUMENTS

| | | | | |
|---|---|---|---|---|
| KR | 1020120057463 A | | 6/2012 | |
| KR | 20230095110 A | * | 6/2023 | H01L 25/50 |
| TW | 201735262 A | * | 10/2017 | H01L 21/568 |
| TW | 1694597 B | * | 5/2020 | H01L 24/06 |
| TW | 1735895 B | * | 8/2021 | H01L 21/67248 |
| WO | WO-2004071700 A2 | * | 8/2004 | H01L 25/50 |
| WO | WO-2007041593 A2 | * | 4/2007 | A61F 2/0077 |
| WO | WO-2022/138280 A1 | | 6/2022 | |

OTHER PUBLICATIONS

International Search Report and Written Opinion on PCT App. PCT/US2023/028832 dated Nov. 15, 2023 (10 pages).

* cited by examiner

100

Provide a First Substrate — 102

Form a First Bonding Layer — 104

Provide a Second Substrate — 106

Form a Second Bonding Layer — 108

Treat the first and/or second bonding layer — 110

Couple the First Substrate to the Second Substrate — 112

Top Wafer

Bottom Wafer

Top Wafer

Bottom Wafer

NEXT GENERATION BONDING LAYER FOR 3D HETEROGENEOUS INTEGRATION

FIELD OF THE DISCLOSURE

This disclosure relates to microelectronic devices including semiconductor devices, transistors, and integrated circuits, including methods of microfabrication.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed, and greater bandwidth, as well as lower power consumption and latency has grown recently, there has grown a need for smaller and more creative packaging techniques of semiconductor dies.

Wafer-to-wafer and chip-to-chip bonding is being implemented to continue Power-Performance-Area-Cost (PPAC) scaling for complex circuits such as are implemented in Systems on Chip (SOCs). Many bonding techniques utilize oxide-to-oxide bonding adhesion and forming integrated interconnect structures through a hybrid bonding technique that enables interconnections to be formed at the bond interface between two wafers or dies. However, prior to bonding the wafers, current technologies typically recess the interconnect structures (e.g., formed with conductive materials, lines, vias, wires, pads, etc.) of respective wafers using at least one etching technique (e.g., wet or dry etching), for instance, to allow proper alignments and expansions (e.g., during a heating or annealing procedures) of the interconnect structures for interconnections. Stated another way, the etching or recessing process of the interconnect structures can cause corner rounding, voids, or roughness of the interconnect structures.

SUMMARY

The present disclosure provides various embodiments for post treatment of materials (e.g., oxide materials, sometimes referred to as bonding materials) for interconnection between the two wafers (or dies, which may be substituted to various references to wafers throughout this disclosure). For example, each wafer can include a respective substrate (e.g., a first substrate of a first wafer and a second substrate of a second wafer). The first and second substrates can include respective interconnect structures (e.g., composed of conductive materials) and dielectric layers around the sidewall and bottom of the interconnect structures. A selective deposition technique can be performed to deposit oxide materials over the top surface of the dielectric layers, or a patterning technique can be performed on a blanket oxide layer to form openings over the interconnect structures. After depositing the oxide materials, the two wafers (e.g., with one of the wafers flipped) can be aligned and bonded/connected/coupled via the oxide materials using at least one bonding/coupling technique. The bonding energy can be enhanced based on the pretreatment of at least one of the wafers. By coupling the wafers, a channel can be formed extending from the top surfaces of the respective interconnect structures. Accordingly, the first and second substrates can be heated/annealed, thereby expanding and physically connecting the interconnect structures of the two wafers. In this way, the present disclosure avoids or minimizes the corner rounding, void, or roughness of the interconnect structures when forming the recesses to couple the wafers. The present disclosure can result in increased bonding energy which may aid alignment between wafers, such as prior to, during, or subsequent to the annealing process.

An embodiment includes a method for fabricating semiconductor devices. The method includes providing a first substrate including a first dielectric layer and a first interconnect structure. The method includes forming a first bonding layer on the first dielectric layer. The method includes treating the first bonding layer, to increase a bond energy between the first bonding layer and one or more corresponding materials. The method includes providing a second substrate including a second dielectric layer and a second interconnect structure. The method includes bonding the first bonding layer with the second substrate.

The operation of treating the first bonding layer can be performed in situ.

The operation of bonding the first bonding layer with the second substrate can form a bond having an energy exceeding 1.5 J/m$^2$.

The operation of treating the first bonding layer can include an application of a plasma comprising $O_2$, $H_2O$, $H_2O_2$, $H_2$, $N_2$, $N_2H_4$ or a combination thereof.

The operation of treating the first bonding layer can include an application of $O_3$ or $H_2O_2$.

The first bonding layer can be selectively deposited.

The first bonding layer can be formed as a blanket layer. A portion of the blanket layer can be removed. The removed portion can be over at least a portion of the first interconnect structure.

The first bonding layer can include a metal oxide.

The first bonding layer can include aluminum oxide ($Al_2O_3$).

The first bonding layer can include aluminum oxide ($Al_2O_3$), or $Al_aO_bC_cN_d$ (where a,b,c,d vary from 0 to 1).

Another embodiment can include a system. The system can include a dielectric deposition portion to deposit a dielectric bonding layer over a first wafer. The system can include a post treatment portion to treat a surface of the dielectric bonding layer. The system can include a deionized water rinse portion to rinse the surface of the first and second wafers. The system can include a bond portion to bond the first wafer to the second wafer. The system can include an anneal portion to couple a first interconnect structure to a second interconnect structure.

The dielectric deposition portion of the system can be configured to deposit the dielectric bonding layer comprising a metal oxide selected from a group consisting of: aluminum oxide ($Al_2O_3$), hafnium oxide ($HfO_2$), and combinations thereof.

The dielectric deposition portion of the system can be configured to deposit the dielectric bonding layer comprising a metal oxide selected from a group consisting of: aluminum oxide ($Al_2O_3$), hafnium oxide ($HfO_2$), $Si_aO_bC_cN_d$ (where a,b,c,d vary from 0 to 1), and combinations thereof.

The post treatment portion of the system can treat the surface of the dielectric bonding layer with a microwave plasma. The plasma can include $H_2O$, $H_2$, or $N_2$. The plasma can be associated with a frequency of about 2.45 GHz.

The post treatment portion of the system can treat the surface of the dielectric bonding layer with a microwave plasma. The plasma can include $H_2O$, $H_2$, or $N_2$. The plasma can be associated with a frequency of greater than 100 MHz.

The bond portion of the system can bond the first wafer and the second wafer with an energy of at least 1.5 J/m².

The dielectric deposition portion of the system can be configured to selectively deposit the dielectric bonding layer over another dielectric layer.

The dielectric deposition portion of the system can be configured to deposit a blanket layer of the dielectric bonding layer over the surface of the first wafer.

Another embodiment can include an equipment front end machine (EFEM). The EFEM can include a dielectric deposition portion to deposit dielectric bonding layers over a plurality of wafers. The EFEM can include a post treatment portion to treat a surface of the dielectric bonding layers. The EFEM can include a de-ionized water rinse portion to a prepare a surface of the plurality of wafers. The EFEM can include a bond portion to align and bond the plurality of wafers. The EFEM can include an anneal portion to electrically couple a first interconnect structure to a second interconnect structure. The EFEM can include a wafer handler configured to convey the plurality of wafers between the respective portions of the EFEM. Each portion of the EFEM can be mechanically coupled to another portion of the EFEM.

The EFEM can include a load port to access the EFEM. The EFEM can include a vacuum portion to generate a vacuum. The vacuum can be maintained between a plurality of the portions of the EFEM.

The post treatment portion can treat the surface of the dielectric bonding layers with a microwave plasma. The plasma can include $H_2O$, $H_2$, or $N_2$. The plasma can be associated with a frequency of about 2.45 GHz.

The bond portion of the EFEM can bond at least two wafers of the plurality of wafers with an energy of at least 1.5 J/m².

The dielectric deposition portion of the EFEM can be configured to selectively deposit the dielectric bonding layer over another dielectric layer.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise. References to "or" may be construed as inclusive so that any terms described using "or" may indicate any of a single, more than one, and all of the described terms.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
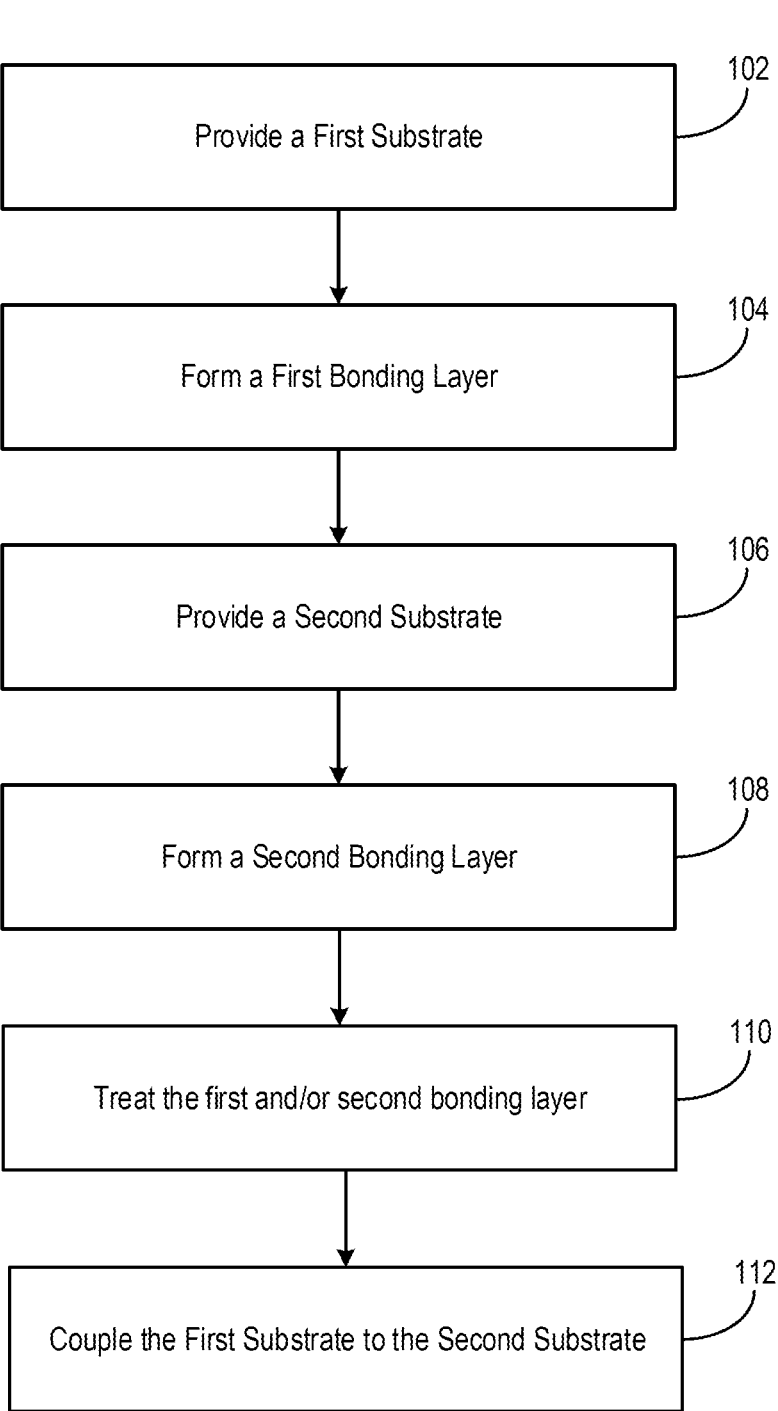
FIG. 1 illustrates a flow chart of a method for making a semiconductor device, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used or other changes may be made without departing from the spirit or scope of the present disclosure. The illustrative embodiments described in the detailed description are not meant to be limiting of the subject matter presented.

According to some implementations, a process for fabricating a semiconductor device is provided utilizing a post-treatment of an oxide bonding layer and wafer bonding techniques. By utilizing the post treatment technique, a bonding energy between respective wafers can be increased, (e.g., to reduce voids, increase cohesion, or increase alignment, such as during transportation or other handling operations). The post-treatment can be performed before coupling or physically connecting the two wafers (or dies). For example, each wafer can include a respective substrate (e.g., a first substrate of a first wafer and a second substrate of a second wafer). The first and second substrates can include respective interconnect structures (e.g., composed of conductive materials) and dielectric layers around the sidewall and bottom of the interconnect structures. A selective deposition technique can be performed to deposit oxide materials over the top surface of the dielectric layers, or a patterning technique can be performed on a blanket oxide layer to form openings over the interconnect structures. After depositing the oxide materials, the two wafers (e.g., with one of the wafers flipped) can be aligned and bonded/connected/coupled via the oxide materials using at least one bonding/coupling technique. The bonding energy can be enhanced based on the pretreatment of at least one of the wafers. By coupling the wafers, a channel can be formed extending from the top surfaces of the respective interconnect structures. Therefore, the first and second substrates can be heated/annealed, thereby expanding and physically connecting the interconnect structures of the two wafers. Accordingly, the present disclosure avoids or minimizes the voids, misalignments of the wafers when coupling the wafers and can further enhance efficiency (e.g., time reduction) in bonding the wafers.

FIG. 1 illustrates a flowchart of an example method 100 for using post-treatment on the surface of a wafer, die, or other substrate to bond (e.g., couple) the surface (e.g., of the wafer) to the surface of another wafer, die, or other substrate. It is noted that the method 100 is merely an example and is not intended to limit the present disclosure. Accordingly, it is understood that additional operations may be provided before, during, and after the method 100 of FIG. 1, and that some other operations may only be briefly described herein.

In various embodiments, operations of the method 100 may be associated with perspective views and cross-sectional views of a semiconductor device 200 at various fabrication stages as shown in FIGS. 2A to 6B, respectively, which will be discussed in further detail below. It should be understood that the semiconductor device 200, shown in FIGS. 2A to 6B, may include a number of other devices such as inductors, fuses, capacitors, coils, etc., while remaining within the scope of the present disclosure. In overview, the method 100 can include operation 102 of providing a first substrate. The method can include operation 104 of forming a first bonding layer (sometimes referred to as a first bonding layer portion). The method 100 can include operation 106 of providing a second substrate. The method 100 can include operation 108 of forming a second bonding layer (sometimes referred to as a second bonding layer portion). The method 100 can include operation 110 of treating at least one of the first bonding layer or the second bonding layer. The method 100 can include operation 112 of coupling the first wafer to the second wafer.

Figure 2A:
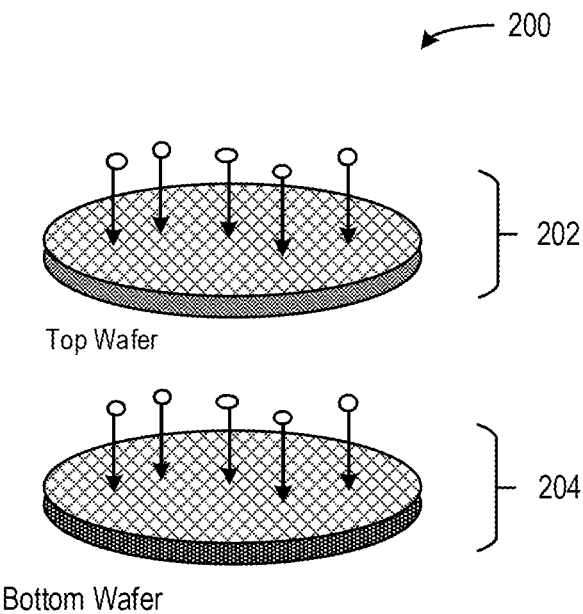
FIGS. 2A and 2B illustrate a perspective view and a cross-sectional view of a semiconductor device, respectively, during various fabrication stages, made by the method of FIG. 1, in accordance with some embodiments.
Figure 2B:
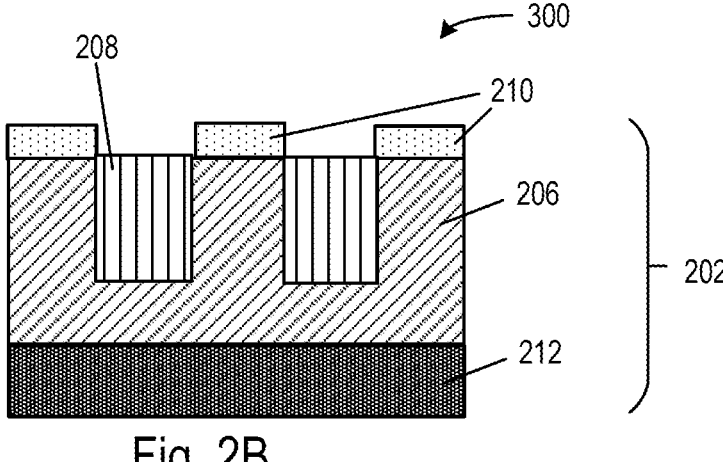

Corresponding to operations 102-110 of FIG. 1, FIG. 2A illustrates a perspective view of the semiconductor device 200 and FIG. 2B illustrates a cross-sectional view 300 of the semiconductor device 200. At least FIGS. 3A-B may also correspond to operations 102-110 of FIG. 1. The semiconductor device 200 can include a first wafer 202 (e.g., top/bottom wafer or die, sometimes referred to as a first substrate) and a second wafer 204 (e.g., bottom/top wafer or die, sometimes referred to as a second substrate). Each wafer 202, 204 can include a semiconductor base portion 212, 312, such as silicon, germanium, a combination thereof, or the like. A dielectric layer 206 is formed over the base portion 212, 312 of the wafers 202, 204. At least a portion of an interconnect structure 208 is disposed within the dielectric layer 206. A bonding layer 210 is formed over the dielectric layer 206. For simplicity and examples, the first wafer 202 can correspond to the top wafer and the second wafer 204 can correspond to the bottom wafer herein. Such a convention is merely to ease the description of the drawings and is not intended to be limiting with respect to this disclosure. The cross-sectional view 300 can correspond to a cross-sectional view of the first wafer 202 or the second wafer 204. In some cases, one or more materials formed for the first wafer 202 may be different from the second wafer 204. In some other cases, the one or more materials formed for the first wafer 202 may be the same as the second wafer 204. For example, the wafers 202, 204 can include or correspond to a respective substrate (not shown). The substrate of the wafers 202, 204 can be a supporting structure forming below or around one or more other materials of the wafers 202, 204.

The substrate may be a semiconductor substrate, such as a bulk semiconductor, a semiconductor-on-insulator (SOI) substrate, or the like, which may be doped (e.g., with a p-type or an n-type dopant) or undoped. The substrate may be or correspond to a respective wafer (e.g., 202 or 204), such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. The material for each of the two wafers may be different.

In some embodiments, the substrate includes a number of device features (e.g., transistors, diodes, resistors, etc., which are not shown for the sake of clarity) formed along a (e.g., frontside or "active") surface of the substrate and a number of interconnect structures (e.g., metal lines, metal vias, etc., which are not shown for the sake of clarity) formed over the device features. The interconnect structures are configured to electrically connect the device features to one another so as to form an integrated circuit, which can function as a logic device, a memory device, an input/output device, or the like. These interconnect structures (e.g., formed of conductive materials, such as Cu, Al, W, Ti, TiN, Ta, TaN, or multiple layers or combinations thereof) may be embedded in one or more dielectric layers (e.g., formed of low-k dielectric materials, such as $SiO_2$), which are sometimes referred to as metallization layers, e.g., 206. Alternatively stated, each dielectric layer 206 can include a number of metal lines and a number of metal vias embedded therein. Over the (e.g., frontside) surface of the substrate, one or more of such dielectric layers 206 can be formed. In some cases, the dielectric layer 206 may be formed on the backside of the substrate. The dielectric layer 206, among other materials discussed herein, can be formed or deposited using at least one suitable deposition technique.

As shown, the dielectric layer 206 can be around or surround the sidewall and bottom of the interconnect structure(s) 208. The dielectric layer 206 may expose the top surface of the interconnect structure 208. The dielectric layer 206 can extend at least from the bottom of the interconnect structure 208 and along the sidewall of the interconnect structure 208. The top surface of the interconnect structure 208 can be flushed/even/slightly recessed with a plane of the top surface of the dielectric layer 206.

Subsequent to forming the dielectric layer 206 and the interconnect structure 208 of the wafers 202, 204, a bonding layer 210 can be formed or deposited using at least one suitable deposition technique (e.g., selective deposition technique). The bonding layer 210 may sometimes be referred to as a bonding film, material, or structure. The bonding layer 210 can be formed with one or more materials selected from a group such as $Si_aO_bC_cN_d$ (where a,b,c,d vary from 0 to 1). For example, the bonding layer 210 can be or include silicon oxide ($SiO_2$), silicon nitride (SiN), silicon oxynitride (SiON), silicon carbonitride (SiCN), silicon oxycarbonitride (SiOCN), aluminum oxide ($Al_2O_3$), hafnium oxide ($HfO_2$), or combinations thereof, among other types of metal oxide materials (e.g., can be $AlCON_x$, or another aluminum dielectric, or another non-aluminum based dielectric). The bonding layer 210 can be or include $Al_aO_bC_cN_d$ (where 'a', 'b', 'c', or 'd' can vary from 0 to 1). The bonding layer need not include aluminum based dielectrics (e.g., 'a' can equal zero). For example, the bonding layer 210 can be (e.g., selectively) formed or deposited by performing at least one suitable deposition process, such as an atomic layer deposition process (ALD, e.g., to deposit materials at exact places), among other types of deposition techniques. Such selective ALD may be referred to as atomic selective deposition (ASD). The bonding layer 210 can be preferentially (or selectively) formed or deposited on the dielectric layer 206 (e.g., on the top surface of the dielectric layer 206) and to provide a dielectric on dielectric (DoD) selectively formed structure. The bonding layer 210 may not be significantly formed on the interconnect structure 208 due to the preferential nature of the ASD process. Such an ASD process may be implemented on either or both of the wafers. In some embodiments, the bonding layer 210 can be formed as a blanket layer over a surface of the semiconductor device 200 and thereafter patterned to reveal a portion of the interconnect structure 208.

Following the formation of the bonding layer 210 the top surface of the interconnect structure 208 can be recessed from the top surface of the bonding layer 210, as shown in at least FIG. 2B. The bonding layer 210 can protrude from the top surface of the dielectric layer 206 by a predetermined height configured for the fabrication/formation/manufacturing process of the semiconductor device 200, such as 1-10 nm, among others. In this case, a dimension (e.g., steepness) of the recess for the top surface of the interconnect structure 208 (e.g., from the top surface of the bonding layer 210) can correspond to the height of the bonding layer 210. At this stage, the interconnect structure 208 can share a coplanar surface with the dielectric layer 206 below the bonding layer 210. In some implementations, the bonding layer 210 can form a channel above the interconnect structure 208 (e.g., the channel corresponding to the recessed portion).

In some implementations, prior to selectively forming the bonding layer for the wafers 202, 204, a portion of at least one of the dielectric layer 206 or the interconnect structure 208 can be polished using at least one suitable polishing process or technique. For example, the surface(s) of the dielectric layer 206 may include excess portions or materials to be removed, such as the top surface of the dielectric layer 206. Hence, a chemical mechanical polishing (CMP) process, an etch process, or combinations thereof can be performed on the surface (e.g., top surface) of the dielectric layer 206 to remove the excess material. In another example, the (e.g., top) surface of the interconnect structure 208 may include excess materials or protrude beyond the top surface of the dielectric layer 206. Accordingly, the interconnect structure 208 may be polished or etched using at least one suitable CMP process, an etching process, or a combination thereof.

In various implementations, polishing the top surface of the dielectric layer 206 and the top surface of the interconnect structure 208 can form a shared coplanar surface, where the top surface of the dielectric layer 206 is leveled with the top surface of the interconnect structure 208. For example, prior to forming the bonding layer, polishing the top surface of the first wafer 202 (e.g., the first substrate) can form a first coplanar surface shared by the dielectric layer 206 and the interconnect structure 208 of the first wafer 202. Similarly, polishing the top surface of the second wafer 204 (e.g., the second substrate) can form a second coplanar surface shared by the dielectric layer 206 and the interconnect structure 208 of the second wafer 204.

In some implementations, the surface of one or more materials (e.g., dielectric layer 206, interconnect structure 208, or bonding layer 210) can be treated using at least one suitable surface treatment process or technique, such as a plasma activation procedure. For example, the (e.g., top or exposed) surface of the dielectric layer 206 may be treated to prepare for bonding or coupling with the bonding layer 210 (e.g., treating the material forming the bonding layer 210). In another example, the (e.g., top) surface of the bonding layer 210 may be treated to prepare for bonding with a different bonding layer (e.g., to bond the bonding layer of the first wafer 202 to the bonding layer of the second wafer 204). In some cases, the at least one surface treatment process may not be performed on the one or more materials (e.g., dielectric layer 206, interconnect structure 208, or bonding layer 210). In some other cases, the interconnect structure 208 may be protected (e.g., using a mask, among other materials/covers) during the surface treatment process of at least one of the dielectric layer 206 or the bonding layer 210.

Referring now to operation 110, the bonding layer 210 of the first wafer 202 is treated. The treatment may be referred to as a post-treatment (e.g., to occur following a deposition of the bonding layer 210 on the first wafer 202). For example, the surface of the bonding layer 210 can be activated by plasma activation. The plasma can be a relatively high density or low damage plasma. For example, the plasma can be higher in density and lower in damage (e.g., to the bonding layer or a copper interconnect) than at least some other plasmas at some power levels to perform various operations, such as a plasma used for plasma enhanced chemical vapor deposition (PECVD). In some embodiments, the plasma can be a high frequency plasma, such as a microwave plasma (e.g., greater than 100 MHz). For example, the plasma can be excited by or oscillate at about 2.45 GHz. The plasma can be inductively coupled plasma, remote plasma, high frequency plasma, atmospheric plasma, or the like. The plasma interactions can activate the surface of the plasma, or avoid contributing to surface roughness or other material removal. For example, a bonding layer can be about 5 nm thick, and can maintain a smooth surface such that the plasma activation increases a bonding energy (e.g., because the increase in activation or energy of dangling bonds such as hydroxyl groups for van der Waals or covalent bonds exceeds any losses due to increased surface roughness).

The plasma can be or include hydrogen (e.g., introduced as $H_2$), nitrogen (e.g., introduced as $N_2$), Oxygen (e.g., introduced as $O_2$), or an $H_2O$ pulse. Further treatment can include hydrogen Peroxide ($H_2O_2$), Hydrazine ($N_2H_4$), plasmas thereof, the like, or combinations of the various plasmas disclosed herein. The semiconductor device can be under vacuum. For example, the vacuum can be maintained or adjusted from a vacuum pressure used during the application of one or more (e.g., selectively) deposited dielectrics (e.g., the bonding layer 210) or the dielectric deposition can be a liquid based process. The plasma post-treatment can occur in a same chamber or machine as the deposition of the bonding layer 210. For example, the first wafer 202 can remain under vacuum in a same chamber or a non-oxidizing gas (e.g., neon or argon) can be introduced to the chamber or equipment, such that oxidation of the surface of the wafer is reduced, relative to an ambient environment. In some embodiments, the second wafer 204 is also activated. For example, the second wafer 204 can be activated according to a same process as the first wafer 202. Thus, the respective wafers can include increased bond strengths (e.g., hydrophilic bonds) therebetween, or between the respective wafers and an intermediary such as a water layer that may be present between the wafers at one or more portions of the bonding or associated processes.

Figure 3A:
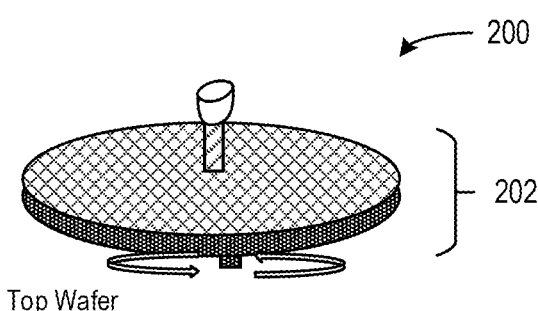
FIGS. 3A and 3B illustrate a perspective view and a cross-sectional view of a semiconductor device, respectively, during various fabrication stages, made by the method of FIG. 1, in accordance with some embodiments.
Figure 3A:
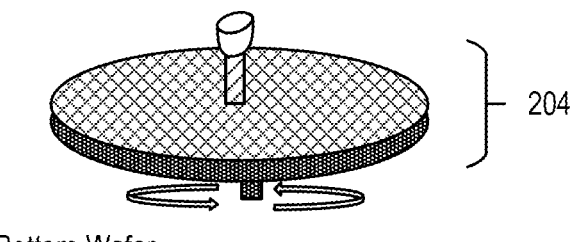
Figure 3B:
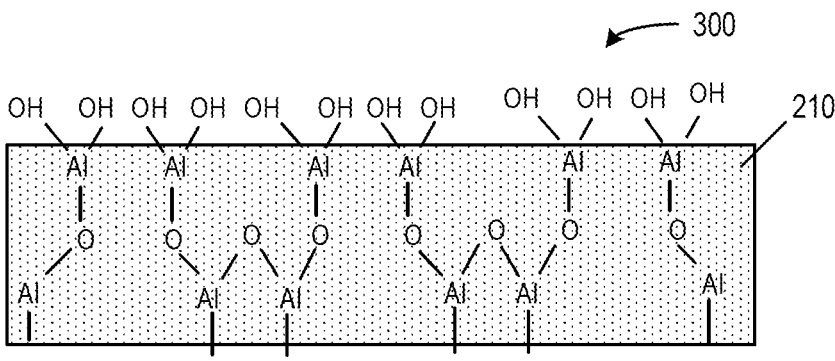

FIG. 3A illustrates a perspective view of the semiconductor device 200 including the first wafer 202 and the second wafer 204. FIG. 3B illustrates a cross-sectional view 300 of the bonding layer 210 of the wafers 202, 204. After depositing the bonding layer 210, a surface hydrophilization process or technique (e.g., among other suitable rinsing techniques) can be performed on the one or more bonding layers 210. For example, the bonding layer 210 can be rinsed by applying deionized (DI) water on the (e.g., top) surface of the bonding layer 210. As shown in at least FIG. 3B, hydroxide (OH) can be introduced to the top surface of the bonding layer 210 via the DI water rinsing process. Therefore, the substrate (e.g., the first or second substrates of the wafers 202, 204) can be rinsed with DI water to hydrophilize the bonding layer 210 of the respective wafers 202, 204. By introducing hydroxide to the surface of the bonding layer 210, the bonding or coupling capabilities between the bonding layer 210 of two wafers 202, 204 can be enhanced (e.g., for preparing the bonding layer 210 for interconnection). For example, the DI water rinsing process can precede, follow, or be included in operation 110.

Figure 4A:
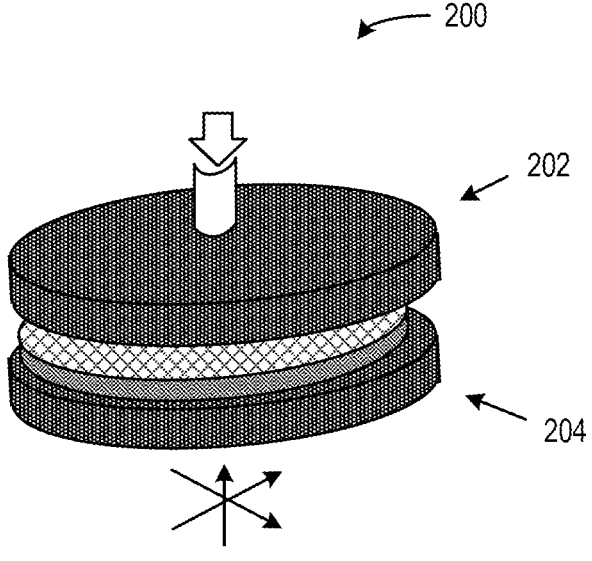
FIGS. 4A and 4B illustrate a perspective view and a cross-sectional view of a semiconductor device, respectively, during various fabrication stages, made by the method of FIG. 1, in accordance with some embodiments.
Figure 4B:
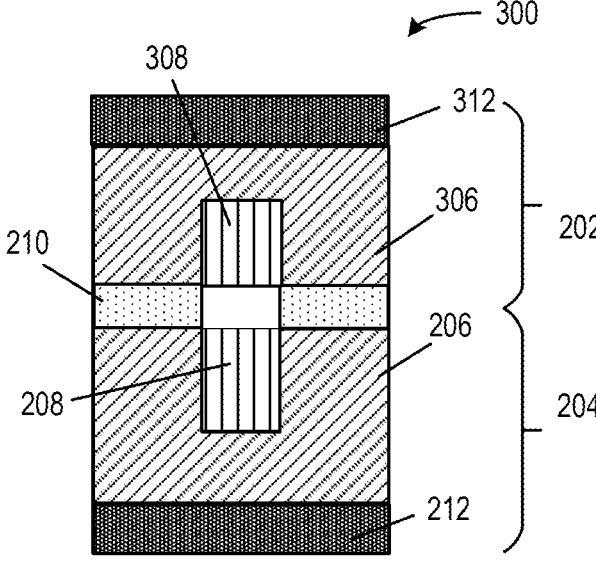

Corresponding to operation 112 of FIG. 1, FIG. 4A illustrates a perspective view of the semiconductor device 200 including the first wafer 202 and the second wafer 204, and FIG. 4B illustrates a cross-sectional view 300 of the wafers 202, 204. As shown, the first wafer 202 can be flipped or inverted (e.g., rotated 180 degrees), where the top of the first substrate (e.g., first wafer 202) is facing down or towards the top of the second substrate (e.g., second wafer 204) facing upward. In some cases, the second wafer 204 can be flipped instead of the first wafer 202. For simplicity and examples herein, the first wafer 202 can include the first substrate including at least the dielectric layer 306, semiconductor base portion 312, and interconnect structure 308, and the second wafer 204 can include the second substrate including at least the dielectric layer 206, semiconductor base portion 212, and interconnect structure 208. Either or both of the wafers 202, 204 can include respective bonding layers 210 (e.g., bonded herein to form a connected bonding layer or a single bonding layer, herein simply referred to as bonding layer 210).

After hydrophilizing or otherwise treating the bonding layer 210, the wafers 202, 204 (e.g., one flipped) can be aligned and bonded/coupled (e.g., using a hybrid bonding process). For example, the first interconnect structure 308 can be aligned with the second interconnect structure 208. In this case, the bonding layer 210 of the wafers 202, 204 can also be aligned. Aligning the interconnect structures 208, 308 can include or refer to positioning the wafers such that the interconnect structures 208, 308 are directly facing each other. In some cases, the sidewalls of the interconnect structures 208, 308 can be coplanar (e.g., vertical plane).

When the wafers 202, 204 are aligned, the first bonding layer (e.g., bonding layer 210 of the first wafer 202) can physically contact, couple, or interconnect with the second bonding layer (e.g., bonding layer 210 of the second wafer 204). For example, the surface of the bonding layers 210 can be prepared for bonding via at least one of the surface hydrophilization or other surface treatment processes (e.g., post-treatment). By applying heat or pressure (e.g., during physical contact between the first and second bonding layers of the respective wafers 202, 204), the first and second bonding layers can be coupled/bonded/interconnected. The pressure applied may comprise a pressure of less than about 30 MPa, and the heat applied may comprise an anneal process at a temperature of about 100 to 500 degrees C., as examples, although alternatively, other amounts of pressure and heat may be used for the hybrid bonding process. The hybrid bonding process may be performed in a $N_2$ environment, an Ar environment, a He environment, an (about 4 to 10% $H_2$)/(about 90 to 96% inert gas or $N_2$) environment, an inert-mixing gas environment, combinations thereof, or other types of environments. Hence, the first and second wafers 202, 204 (e.g., first and second substrates) can be coupled based on the physically contacting at least the bonding layers. In some cases, the coupled first and second bonding layers can form the singular bonding layer 210 shown in FIG. 4B.

In some implementations, the bond between the wafers 202 (e.g., via the bonding layer 210 at this stage) can include non-metal-to-non-metal bonds or metal-to-metal bonds. A portion of the hybrid bonding process may comprise a fusion process that forms the non-metal-to-non-metal bonds, and a portion of the hybrid bonding process may comprise a copper-to-copper bonding process that forms the metal-to-metal bond, for example. The term "hybrid" refers to the formation of the two different types of bonds (e.g., between the bonding layers 210 and interconnect structures 208, 308) using at least one bonding process, rather than forming only one type of the bonds, as is the practice in other types of wafer-to-wafer or die-to-die bonding processes, for example.

In various implementations, the channels associated with the respective recessed region of the interconnect structures 208, 308 can form a shared channel in response to coupling the bonding layers 210. This channel can extend from the top surface of the first interconnect structure 308 to the top surface of the second interconnect structure 208. The channel can provide an opening for the interconnect structures 208, 308 to couple/bond.

In some implementations, the bonding layer 210 may be deposited on the top surface of one of the dielectric layers 206, 306. In this case, the wafers 202, 204 (e.g., one flipped) can be aligned and bonded/coupled using at least one suitable bonding process or technique. For example, the first interconnect structure 308 can be aligned with the second interconnect structure 208. In this case, (e.g., the top surface of) the bonding layer 210 of one of the wafers 202, 204 can also be aligned with (e.g., the top surface of) the dielectric layer 206, 306 of the other wafer 202, 204. The surface of the bonding layer 210 (or the surface of the dielectric layer 206, 306 of the other wafer 202, 204) can be prepared for bonding via at least one suitable surface treatment process, for example. Hence, by applying heat or pressure (e.g., during physical contact between the bonding layer 210 and the dielectric layer 206, 306 of the other wafer 202, 204), the two wafers 202, 204 can be coupled/bonded/interconnected.

In some embodiment, the surface treatment (e.g., the post treatment) can reduce or eliminate an applied heat or pressure to couple the wafers, relative to one or more untreated wafers.

Figure 5A:
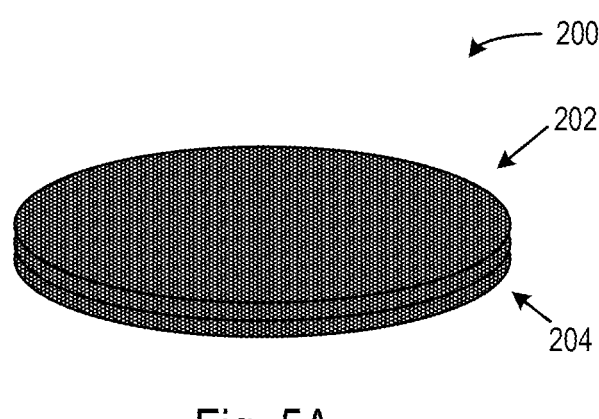
FIGS. 5A and 5B illustrate a perspective view and a cross-sectional view of a semiconductor device, respectively, during various fabrication stages, made by the method of FIG. 1, in accordance with some embodiments.
Figure 5B:
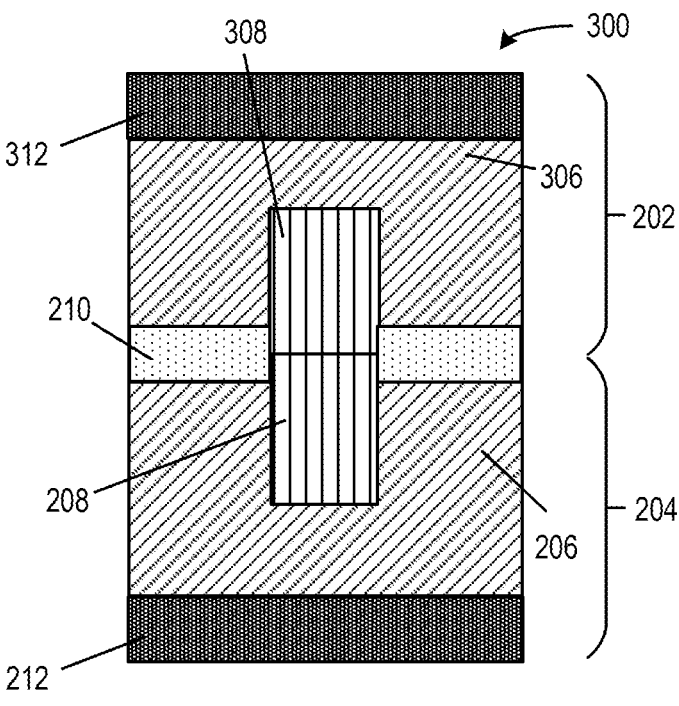

FIG. 5A illustrates a perspective view of the semiconductor device 200 with the coupled first and second wafers 202, 204. FIG. 5B illustrates a cross-sectional view 300 of the coupled wafers 202, 204. For example, after coupling the bonding layers 210, the first substrate and the second substrate can be heated (e.g., annealed or other heating processes) using at least one suitable heat treatment process, such as rapid thermal processing (RTP). Heating the substrates can expand the interconnect structures 208, 308 along the channel surrounded by the bonding layer 210 and the dielectric layers 206, 306 (formed over the semiconductor base portions 212, 312). Hence, annealing the substrates can increase a dimension (e.g., height) of the interconnect structures 208, 308 along the channel to physically contact each other (e.g., create physical contact between the interconnect structures 208, 308 through/via the recessed portion).

In some implementations, the interconnect structures 208, 308 may expand to the same dimension. In some other cases, the interconnect structures 208, 308 may expand in include the same dimension or at the same rate, such that the first or the second interconnect structure 208, 308 expands more than the other for forming the physical contact. In some implementations, the coupling of the first and second substrates (e.g., first and second wafers 202, 204) can refer to or correspond to the coupling of the bonding layers 210 and the interconnect structures 208, 308.

Figure 6A:
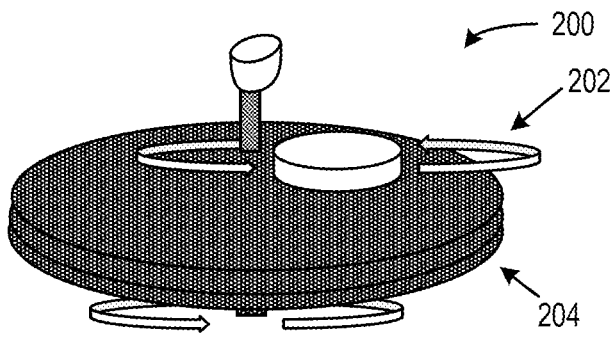
FIGS. 6A and 6B illustrate a perspective view and a cross-sectional view of a semiconductor device, respectively, during various fabrication stages, made by the method of FIG. 1, in accordance with some embodiments.
Figure 6B:
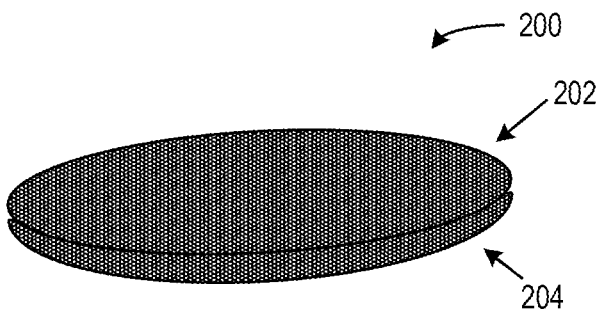

FIG. 6A illustrates a perspective view of the semiconductor device 200 including the first and second wafers 202, 204 undergoing at least one thinning or etching process. FIG. 6B illustrates a perspective view of the semiconductor device 200 including the first and second wafers 202, 204 after the thinning process. The thinning process can be performed before, during, or after bonding the interconnect structures 208, 308. The thinning process can be performed on the first substrate or the second substrate using at least one suitable etching technique, such as a chemical etching process.

For example, the bottom surface of the first wafer 202 can be etched or thinned using the at least one suitable etching technique. In some cases, the semiconductor device 200 can be inverted, such that the second wafer 204 (e.g., second substrate) is the top wafer above the first wafer 202 (e.g., first substrate). In this case, the bottom of the second wafer 204 can be etched. In some cases, the semiconductor device 200 may not be inverted, and at least one of the first or second wafers 202, 204 can be etched. Etching the bottom surface of at least one wafer 202, 204 can reduce the dimension (e.g., thickness) of the semiconductor device 200.

In some implementations, after thinning the wafers 202, 204, at least one suitable lithography technique, such as photolithography, can be performed on at least one of the wafers 202, 204. For example, after bonding the various interconnect structures (e.g., 208, 308), thinning the wafers 202, 204, among other fabrication procedures, one or more patterns can be formed in at least one of the first or second substrates, thereby enabling (e.g., electrical) connection with the interconnect structures 208, 308, among other materials.

Figures 7A, 7B, 7C:
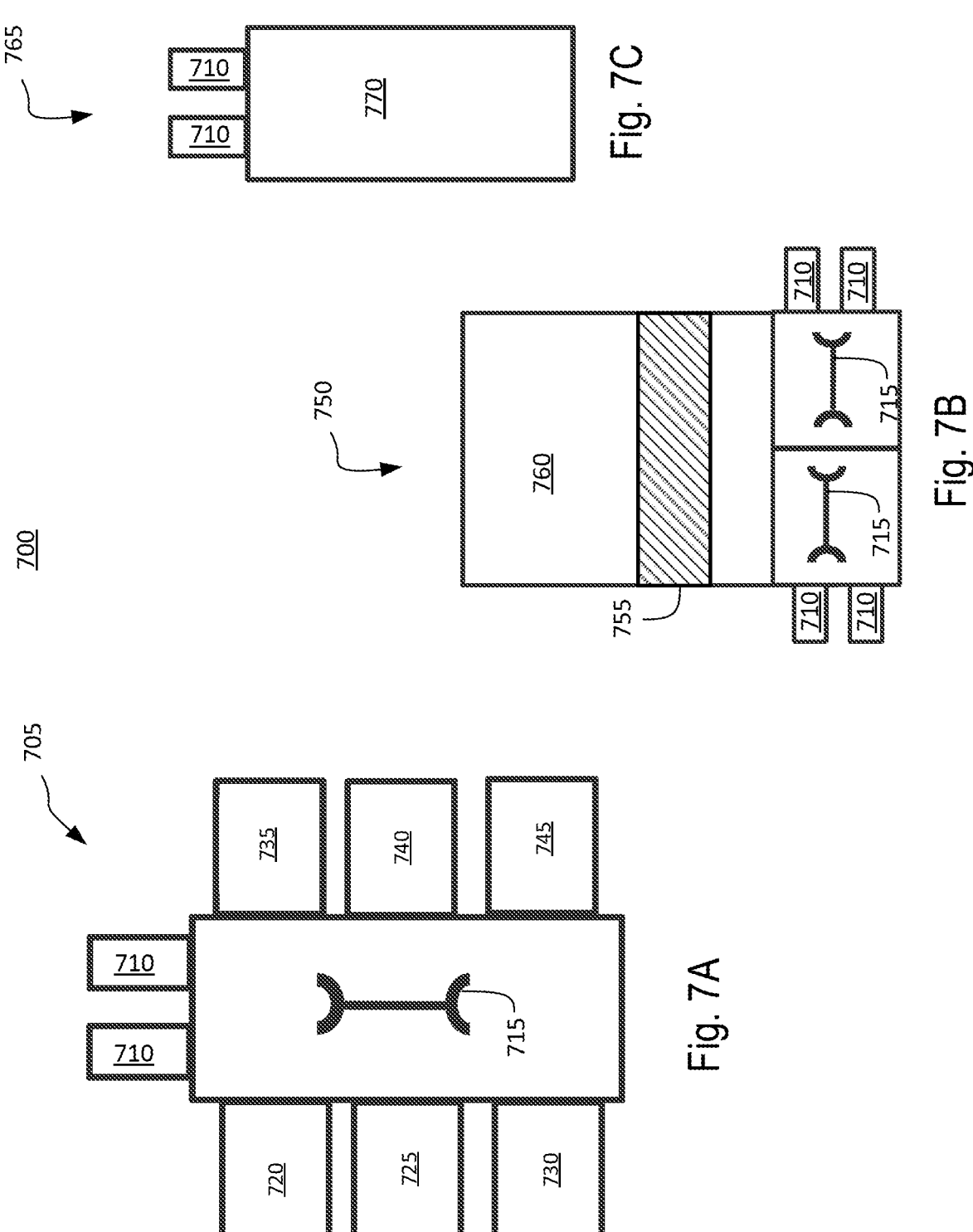
FIGS. 7A, 7B, and 7C illustrate a block diagram of an EFEM, a wafer bonding station, and an annealing chamber, respectively, in accordance with some embodiments.

FIG. 7A depicts a system 700 including an electric front end machine (EFEM) 705, which may also be referred to as an electric front end module. According to some embodiments, the EFEM 705 can perform one or more of the operations of method 100. The EFEM 705 includes one or more load ports 710 to receive a wafer into the EFEM 705.

For example, the load port 710 can be configured to receive a cassette comprising a plurality of vertically stacked wafers. The EFEM 705 can include a wafer handler 715, such as a multi-link robotic arm configured to transport one or more wafers from the load port 710 or a portion of the EFEM 705, to the load port 710 or another portion of the EFEM 705.

The EFEM 705 can include one or more portions, such as process chambers. Each portion can be configured to perform one or more wafer processing operations or suboperations, some of which are described henceforth, or can be performed according to the operations or suboperations disclosed above. Each portion can be duplicated, such as according to the variations disclosed herein or otherwise known, or can include a plurality of sub-chambers to execute one or more suboperations. For example, an etch chamber 720 can be configured to apply an etchant to a surface of a semiconductor device. The etch chamber 720 can be configured to apply a wet etch to a surface of the semiconductor device, or a plasma gas containing one or more etchants to the semiconductor device to etch all or a portion of the semiconductor device. In some embodiments, the etch chamber 720 can include one or more etch chambers 720 for wet etches, and one or more etch chambers 720 for dry (e.g., plasma) etches.

A particle remover chamber 725 can remove various particles, contaminants, or the like from a surface of a wafer. For example, the particle remover chamber 725 can remove environmental contaminants from inside or outside the EFEM 705, or reactants or other detritus from various EFEM 705 operations. For example, the particle remover chamber 725 can apply an oxidizer such as aluminum hydroxide ($NH_4O_4$) or hydrogen peroxide ($H_2O_2$) in a solution comprising DI water. The solution can be cycled, filtered, or replaced. According to some embodiments, one or more chambers can be associated with the particle remover chamber 725 such that the particles are removed from the wafer prior or subsequent to the other process chambers. A pre-clean chamber 730 can be included to clean the surface of the wafer or form a passivation layer upon a surface thereof. For example, a wet solution including hydrogen peroxide ($H_2O_2$) or an acid such as hydrochloric acid (HCL) acid. In some embodiments, a single chamber can perform a plurality of cleaning or other preparatory operations (e.g., pre-cleaning or particle removal). Wafers can be transported to the particle remover chamber 725 or the pre-clean chamber 730 for various preparatory operations. For example, the wafers can be prepared prior to being transported to the other chambers, such as the chambers applying heat to the wafers, such as an annealing furnace 765 or a dielectric deposition chamber 740.

A blocking/SAM chamber 735 can apply self-assembled monolayers. For example, the monolayer material can be introduced and can assemble into a monolayer based on a selective coupling between a portion of the monolayer material (e.g., a head group) and a surface of the semiconductor device. More specifically, the SAM may protect contacts that would otherwise be exposed during the formation and processing steps for the bonding layer. The monolayer material can be introduced in a liquid or gas phase. In some embodiments, the monolayer can include one or more reactants to form the monolayer material or to remove a portion thereof following formation of the monolayer. In some embodiments, a vacuum may be generated by the SAM chamber 735 or another portion of the EFEM 705. For example, a plurality of portions of the EFEM 705 can be generally or selectively hermetically sealed (e.g., based on the actuation of one or more hermetic panels). The vacuum can be adjusted or selectively engaged to remove a reactant, oxidizer, or other impurity (e.g., air) from the EFEM 705. For example some processes can use high vacuum, low vacuum, no vacuum, and so on. In some embodiments, the EFEM 705 (e.g., any portion of the EFEM 705 accessed through load ports 710 thereof) can share the vacuum. A dielectric deposition chamber 740 can apply a dielectric material to a surface of a wafer. For example, the deposition chamber 740 can apply the dielectric to a wafer to form the first dielectric layer, or to form a bonding layer comprising a dielectric (e.g., aluminum oxide ($Al_2O_3$) or other dielectrics described herein (e.g., for the dielectric layer 206 or the first bonding layer 210 of FIG. 2B, among others). In some embodiments, an aluminum oxide ($Al_2O_3$) bonding layer can be formed with a pre-curser comprising TMA ($AL_2$ $(CH_3)_6$) over the first dielectric layer of the semiconductor device 200 of FIG. 2B, and others. The deposition chamber 740 can apply the dielectric by one or more processes described with reference to FIG. 2B, and others. For example, the deposition chamber 740 can apply a vapor comprising a plurality of precursors to form the dielectric (e.g., CVD), or a physical vapor deposition process such as sputtering or evaporation.

A post treatment chamber 745 can prepare (e.g., activate, passivate, and the like) a wafer for bonding. For example, the post treatment chamber 745 can treat a surface of the wafer subsequent to the deposition of a bonding layer (e.g., subsequent to a selective deposition thereof or to a patterning of a blanket layer thereof). For example, a high density plasma configured to interact with the surface of the semi-conductor device can be applied to increase the bonding energy between two wafers. The plasma can be a microwave plasma having a frequency between about 1 GHz, and 100 GHz. For example, the plasma can oscillate or be energized by a source of about 2.45 GHz. The plasma can include water such as DI water ($H_2O$), dihydrogen ($H_2$), dinitrogen ($N_2$), combinations thereof, and the like.

According to some embodiments, the post-treatment chamber 745 can raise a bonding energy of one or more treated wafers to more than 1.5 Joules per meter squared ($J/M^2$) (e.g., to about 1.85 $J/M^2$). In some embodiments, the pretreatment can be performed in situ following the deposition or patterning of the bonding layer (e.g., the post-treatment chamber 745 may be, include, share portions with, or be in proximity to the deposition chamber 740).

FIG. 7B depicts the system 700 including a wafer bonding station 750. For example, the wafer bonding station 750 can include one or more load ports 710 to introduce or remove wafers. The wafer bonding station 750 can include one or more wafer handlers 715 to transport the wafer into or out of the wafer bonding station 750, or between portions thereof. In some embodiments, the wafer handlers 715 can be configured to vertically flip one or more wafers, or to interface with a flipped wafer or cassettes having one or more flipped wafers therein. The wafer bonding station 750 can include a cleaning or rinsing chamber, such as a DI water rinse chamber 755, which can evacuate water by a forced flow, vacuum, or spinning of the wafer. The wafer bonding station 750 can include an alignment and bonding chamber 760 (also referred to as a bond portion). The alignment and bonding chamber 760 can include an alignment sensor such as advanced optical inspection, an IR detector, etc. The bonding chamber 760 can further include one or more alignment adjustment motors communicatively coupled to the alignment sensors such that the alignment adjustment motors can adjust the wafer responsive to an alignment sensed by the alignment sensors, to align one or more features of the wafers. For example, the features to be aligned can include the interconnect structure 208 of FIG. 2B, and others.

The bonding layer of a wafer can be connected to a dielectric layer of another wafer (e.g., another bonding layer or other dielectric layer thereof). For example, one or more bonding layers processed by the post treatment chamber 745 can be interfaced to another wafer (e.g., another wafer which has been processed by the post treatment chamber 745). The bond between respective wafers can be based on the chemi-cal bonding energy therebetween. In some embodiments, one or more of the bonded wafers can be connected to another wafer, such as by the bonding energy of one or more surfaces or by other interconnects (e.g., annealed copper through silicon vias). For example, the various equipment depicted herein can be operated iteratively to form wafer stacks of various dimensions (e.g., two layers, 96 layers, or 512 layers).

FIG. 7C depicts the system 700 including an annealing furnace 765. The annealing furnace 765 includes one or more load ports 710 to receive a wafer. The annealing furnace 765 can include an annealing chamber 770 to electrically connect interconnect structures of bonded wafers. For example, bonded wafers can be heated to form connections between copper interconnect portions of the respective wafers, micro bumps associated therewith, or other further conductive materials. For example, the anneal-ing chamber 770 can be configured to select a temperature (e.g., about 100 C to about 400 C and a time (e.g., about 2, about 3, or about 20 hours). In some embodiments the annealing chamber 770 can be configured with a tempera-ture profile having a plurality of temperatures, rise rates, or fall rates associated with a plurality of times of the annealing time period. In some embodiments, the annealing furnace 765 can perform further heat treatment processes, such as RTP. For example, the other heat treatment processes can be substituted for or added to the annealing chamber 770.

Figure 8:
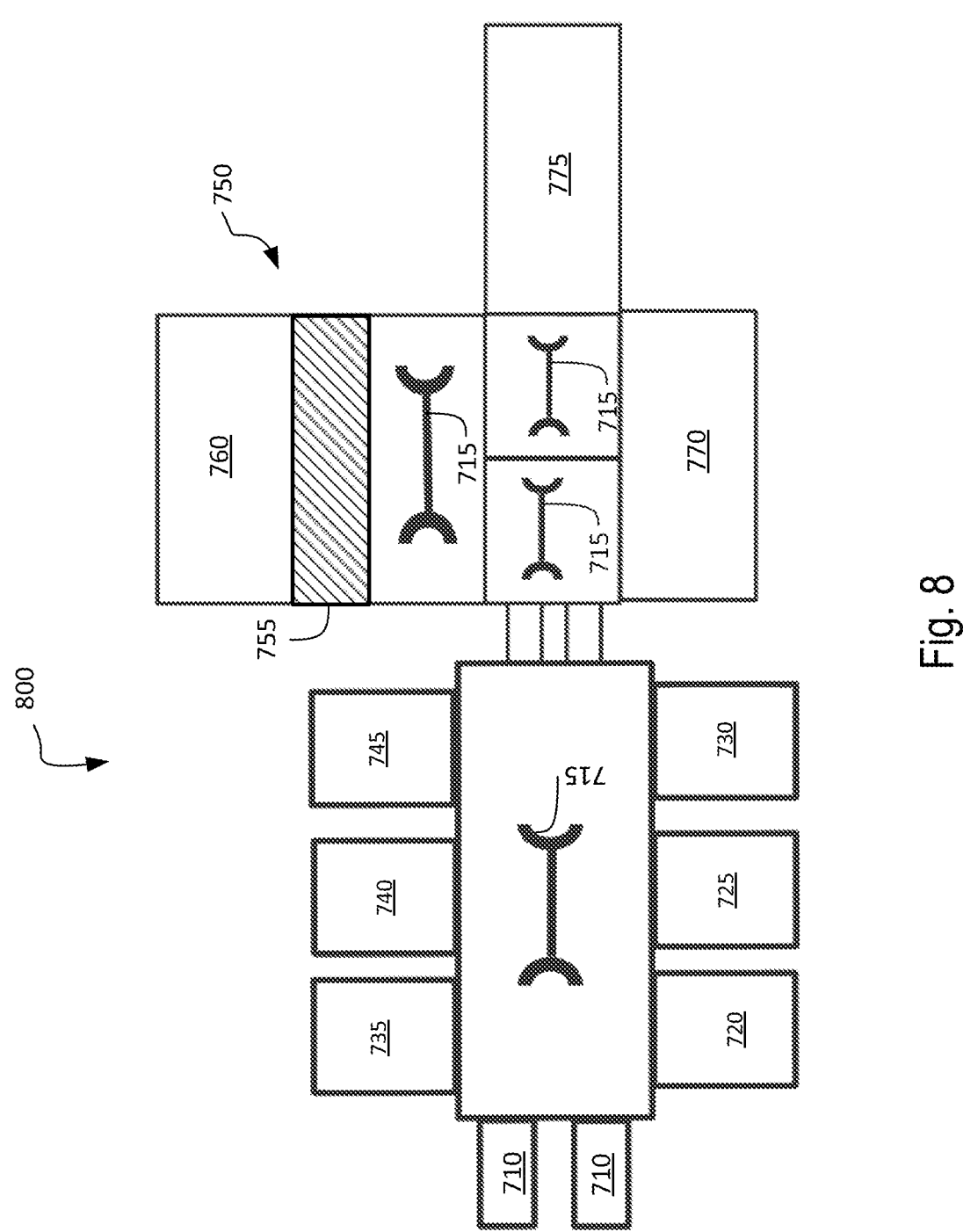
FIG. 8 illustrates a block diagram of an integrated EFEM for making a semiconductor device, in accordance with some embodiments.

FIG. 8 depicts an integrated EFEM 800. The integrated EFEM 800 can include (e.g., is mechanically coupled to) any chamber of the EFEM 705 of FIG. 7, as well as additional chambers or other portions. For example, the integrated EFEM 800 can include an annealing chamber 770, a wafer bonding chamber 750 and an inspection cham-ber 775 (also referred to as a metrology portion). In some embodiments, the integrated EFEM 800 includes one or more wafer handlers 715 such that a wafer can pass through a load port 710, each respective portion of the integrated EFEM 800, or any subset thereof. Some examples of addi-tional chambers include an etch chamber 720, particle remover chamber 725, pre-clean chamber 730, blocking/ SAM chamber 735, dielectric deposition chamber 740, and a post treatment chamber 745.

The inspection chamber 775 can include various inspec-tion assemblies to inspect one or more wafers. For example, the inspection chamber 775 can inspect the planarity, align-ment, or thickness of a one or more wafers. Test instruments, coupled to a processor or a non-transitive memory can test or characterize various performance, mechanical, or other attributes of the wafer based on the inputs from the test instruments. For example, the inspection chamber 775 can include any of the sensors described with respect to the wafer bonding station 750 of the EFEM 705 of FIG. 7.

A wafer grinding chamber (not depicted) can grind one or more wafers. For example, the backside (e.g., the side of the wafer lacking an exposed interconnect) can be ground, polished, or otherwise mechanically or chemically pro-cessed to reduce a thickness thereof. The reduction in thickness can expose the interconnect, such that a plurality of wafers can be stacked, and the interconnects can pass signals through the wafer (e.g., to an active surface of one or more other wafers including circuits disposed thereupon). In some embodiments, the wafer grinding chamber can be collocated with (e.g., to reduce handling operations) or remote from the integrated EFEM 800 (e.g., to reduce the grinding or polishing particles introduced to the integrated EFEM 800).

Figure 9:
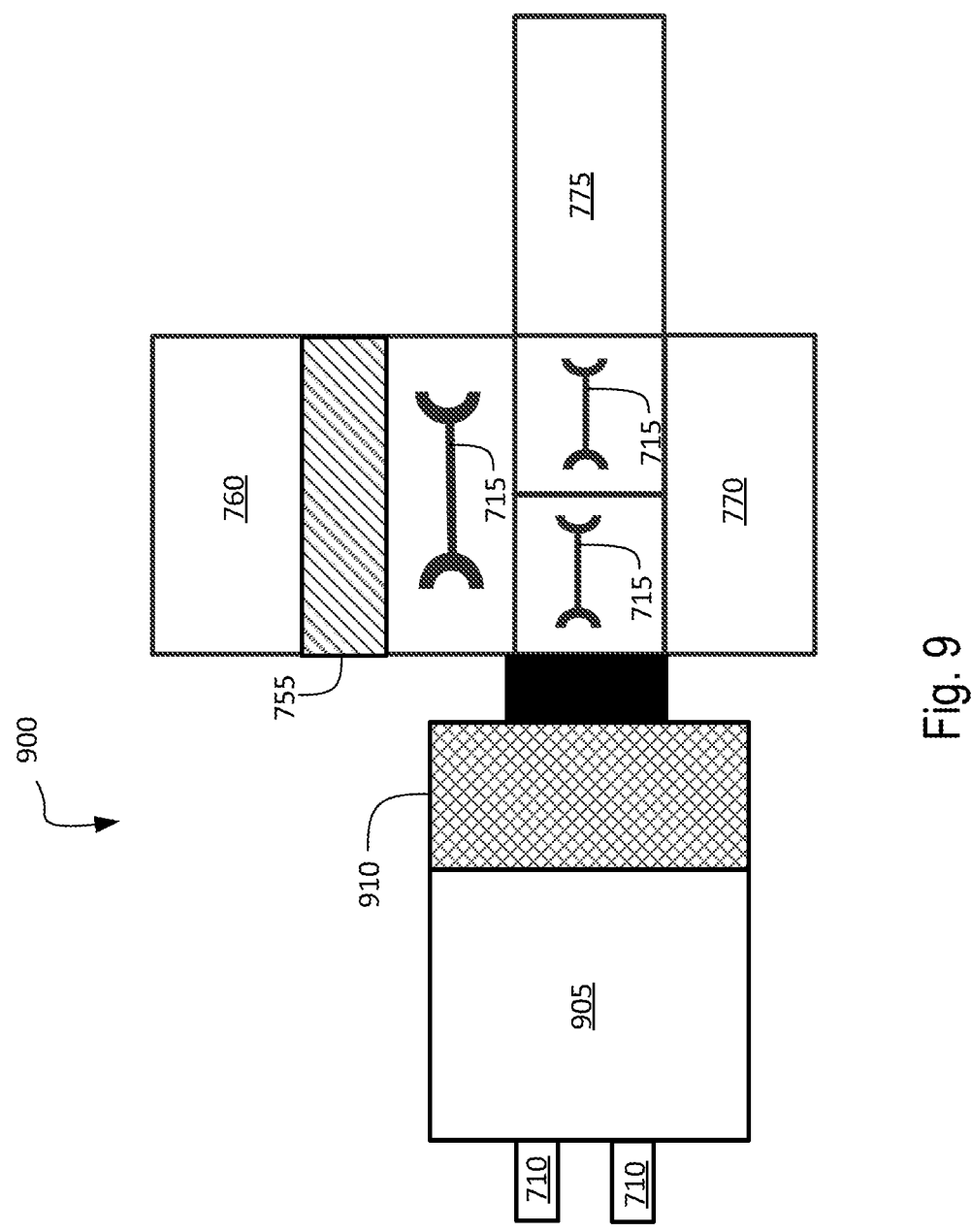
FIG. 9 illustrates a block diagram of another integrated EFEM for making a semiconductor device, in accordance with some embodiments.

FIG. 9 depicts another integrated EFEM 900. In some embodiments, the integrated EFEM 900 includes one or more wafer handlers 715 such that a wafer can pass through a load port 710, each respective portion of the integrated EFEM 900, or any subset thereof. The integrated EFEM 900 includes a SAM chamber 905. The SAM chamber 905 can be similar to the blocking/SAM chamber 735, or may be a variant thereof. For example, the SAM chamber 905 can be configured to apply a monolayer to a surface of a wafer by the application of at least one liquid based process. For example, a liquid comprising a molecule having a head configured to attach to the wafer, and a tail waving a lesser attraction (e.g., a repulsion) from the wafer. In some embodiments, a liquid can include a reagent applied to process the monolayer, or a portion thereof. For example, a tail portion can be removed from the monolayer based on the application of a reagent reacting therewith. As disclosed above, some chambers, such as the SAM chambers 905 can perform a plurality of operations or sub operations. For example, the SAM chamber 905 can further be configured to perform post treatment (e.g., as disclosed with regard to the particle remover chamber 725, pre-clean chamber 730, or post-treatment chamber 745 of FIG. 7, or variants thereof).

An ALD chamber 910. Can be configured to deposit a thin film (e.g., one atom thick). For example, the ALD chamber 910 can apply a first agent to the surface of the wafer. Any excess agent or reactant can thereafter be expelled from the chamber (e.g., to avoid reactions with a reagent introduced thereafter). A reagent (e.g., a second agent) can be applied to the surface of the wafer. For example, the reagent can couple to the surface of the agent. The excess reagent can thereafter be expelled from the chamber. The agent and reagent can be alternatively applied to form a layer of a desired thickness. In some embodiments, additional agents or reagents can be deposited (e.g., three, four, or more alternated agents/reagents), or can be deposited in a non-regular repeating pattern. In some embodiments, the ALD process can be a gas or plasma phase ALD process. The ALD process can be or include a solution based ALD process in which one or more agent or reagent is delivered to or from the ALD chamber 910 in solution (e.g., a solution comprising DI water). In some embodiments, the ALD process can include the application of heat, light, or other energy. For example, $Al_2O_3$ can be formed by alternative deposition of TMA over a surface, which can thereafter be combined with water (e.g., water vapor or a solution including DI water) to form Aluminum Oxide ($Al_2O_3$).

Figure 10:
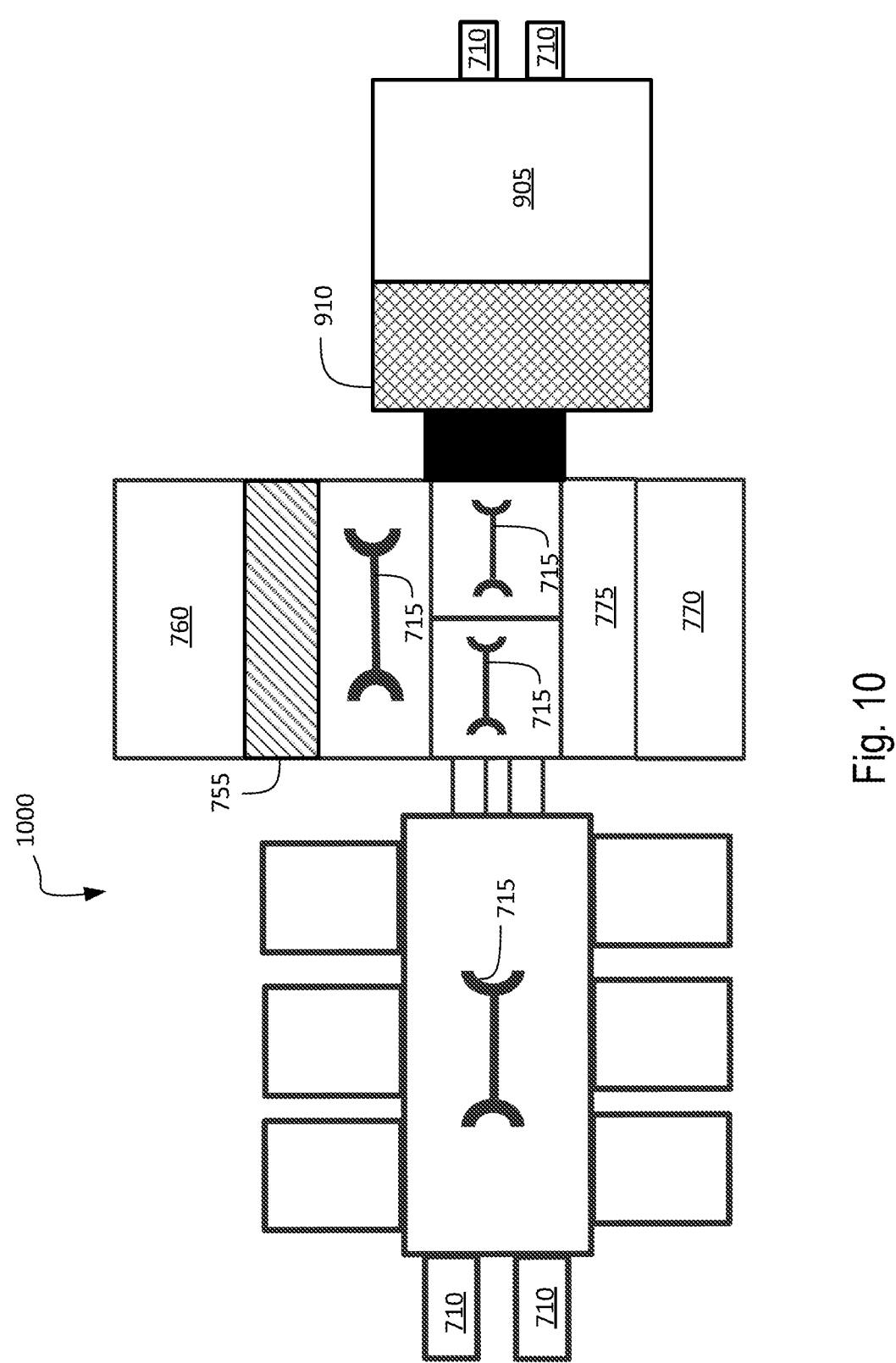
FIG. 10 illustrates a block diagram of yet another integrated EFEM for making a semiconductor device, in accordance with some embodiments.

FIG. 10 depicts a yet another integrated EFEM 1000. The integrated EFEM 1000 includes a further arrangement of the chambers and other EFEM portions depicts in FIG. 7, FIG. 8, or FIG. 9. Various combinations of the components of the EFEM can be added, substituted, omitted or modified. FIG. 10, and the other figures herein depict the various elements thereof to illustrate an example, which can be varied according to the present disclosure. As noted above, the drawings are not drawn to scale, indeed, some elements of the drawings may be enlarged or minimized to better illustrated one or more features thereof. Moreover, the positions, shapes, abutting portions, and so forth are not intended to be limiting. According to a position or function of one or more load ports 710 or wafer handlers 715, various positioning of the illustrated portions can be beneficial. For example, the alignment and bonding chamber 760, DI water rinse chamber 755, annealing chamber 770, inspection chamber 775, SAM chamber 905, or ALD chamber 910 van be laterally disposed. Such a disposition can be or include a conveyer belt, or one or a plurality of multi-link robotic arms. Further, the position of various portions can be based on one or more portions having a vacuum cycle in one or more processes thereof. For example, a hermetically sealed zone of the integrated EFEM 1000 can include a hermetic seal isolating the hermetically sealed zone from at least one other portion of the integrated EFEM 1000.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for fabricating semiconductor devices, comprising:
   providing a first substrate including a first dielectric layer and a first interconnect structure;

forming a first bonding layer on the first dielectric layer after providing the first substrate including the first dielectric layer and the first interconnect structure, the first bonding layer comprising a plurality of openings over the first interconnect structure;

providing a second substrate including a second dielectric layer and a second interconnect structure;

treating at least one of the first bonding layer or a second bonding layer, the second bonding layer formed over the second dielectric layer, to increase a bond energy between the first bonding layer and one or more corresponding materials;

bonding the first bonding layer with the second substrate to enclose the plurality of openings between the first interconnect structure and the second interconnect structure; and heating the first substrate and the second substrate to couple the first interconnect structure with the second interconnect structure;

wherein forming the first bonding layer comprises:

depositing a blanket layer over the first dielectric layer; and removing a portion of the blanket layer to form the plurality of openings over at least a portion of the first interconnect structure.

2. The method of claim 1, wherein a bonding energy between the first bonding layer and the second substrate exceeds 1.5 J/m$^2$.

3. The method of claim 1, wherein the treating the first bonding layer comprises an application of a plasma comprising $O_2$, $H_2O$, $H_2O_2$, $H_2$, $N_2$, $N_2H_4$, or a combination thereof.

4. The method of claim 1 wherein treating the first bonding layer comprises an application of $O_3$ or $H_2O_2$.

5. The method of claim 1, wherein the first bonding layer comprises a metal oxide.

6. The method of claim 1, wherein the first bonding layer comprises aluminum oxide ($Al_2O_3$), or $Al_aO_bC_cN_d$ (where a,b,c,d vary from 0 to 1).

7. A system, comprising:

a dielectric deposition portion configured to deposit a dielectric bonding layer over a first wafer, the dielectric bonding layer comprising a plurality of openings over a first interconnect structure, the first wafer comprising the first interconnect structure and a dielectric layer, and the dielectric bonding layer being deposited on the dielectric layer after the first interconnect structure and the dielectric layer of the first wafer are formed;

a post treatment portion configured to treat a surface of the dielectric bonding layer;

a de-ionized water rinse portion configured to rinse the surface of the first wafer and a second wafer;

a bond portion configured to bond the first wafer to the second wafer to enclose the plurality of openings between the first interconnect structure and a second interconnect structure of the second wafer; and an anneal portion configured to couple the first interconnect structure to the second interconnect structure wherein the dielectric bonding layer is deposited by a deposition process selective to the first dielectric layer, relative to the first interconnect structure.

8. The system of claim 7, wherein the dielectric deposition portion is configured to deposit the dielectric bonding layer comprising a metal oxide selected from a group consisting of: aluminum oxide ($Al_2O_3$), hafnium oxide ($HfO_2$), $Si_aO_b$ $C_cN_d$ (where a,b,c,d vary from 0 to 1), and combinations thereof.

9. The system of claim 7, wherein:

the post treatment portion treats the surface of the dielectric bonding layer with a microwave plasma; and the bond portion bonds the first wafer and the second wafer with an energy of at least 1.5 J/m$^2$.

10. The system of claim 9, wherein the plasma comprises $H_2O$, $H_2$, or $N_2$, and the plasma is associated with a frequency greater than 100 MHz.

11. The system of claim 7, wherein the dielectric deposition portion is configured to deposit a blanket layer of the dielectric bonding layer over the surface of the first wafer.

12. An equipment front end machine (EFEM), comprising:

a dielectric deposition portion configured to deposit dielectric bonding layers over a plurality of wafers, the plurality of wafers each comprising an interconnect structure and a dielectric layer, and each dielectric bonding layer being deposited on a respective dielectric layer of a respective wafer after a respective interconnect structure and the respective dielectric layer of the respective wafer are formed to form a plurality of openings over the interconnect structure;

a post treatment portion configured to treat a surface of the dielectric bonding layers;

a de-ionized water rinse portion configured to a prepare a surface of the plurality of wafers;

a bond portion configured to align and bond the plurality of wafers to enclose the plurality of openings between the interconnect structures of the respective wafers;

an anneal portion configured to electrically couple a first interconnect structure to a second interconnect structure; and a wafer handler configured to convey the plurality of wafers between the respective portions of the EFEM; and wherein forming the dielectric bonding layers comprises:

depositing a blanket layer over the first dielectric layer; and removing a portion of the blanket layer to form the plurality of openings over at least a portion of the first interconnect structure wherein each portion of the EFEM is mechanically coupled to another portion of the EFEM.

13. The EFEM of claim 12, comprising:

a load port to access the EFEM, and a vacuum portion to generate a vacuum, wherein the vacuum is maintained between a plurality of the portions of the EFEM.

14. The EFEM of claim 12, wherein:

the post treatment portion treats the surface of the dielectric bonding layers with a microwave plasma;

the plasma comprises $H_2O$, $H_2$, or $N_2$; and the plasma is associated with a frequency of about 2.45 GHz.

15. The EFEM of claim 12, wherein the bond portion bonds at least two wafers of the plurality of wafers with an energy of at least 1.5 J/m$^2$.

16. The method of claim 1, wherein the first interconnect structure is at least partially embedded in the first dielectric layer, and wherein the first interconnect structure comprises a number of metal lines and a number of metal vias embedded therein.

17. The system of claim 7, wherein the first interconnect structure is at least partially embedded in the dielectric layer, and wherein the dielectric layer comprises a number of metal lines and a number of metal vias embedded therein.

18. The EFEM of claim 12, wherein the first interconnect structure is at least partially embedded in the dielectric layer, and wherein the dielectric layer comprises a number of metal lines and a number of metal vias embedded therein.

\*　\*　\*　\*　\*